(12) United States Patent
Abbott et al.

(10) Patent No.: US 9,240,621 B2
(45) Date of Patent: Jan. 19, 2016

(54) MICRO-STRIP CROSSTALK COMPENSATION USING STUBS

(75) Inventors: John J. Abbott, Dupont, WA (US); Richard K. Kunze, Woodinville, WA (US)

(73) Assignee: Intel Corporation, Santa Clara, CA (US)

(*) Notice: Subject to any disclaimer, the term of this patent is extended or adjusted under 35 U.S.C. 154(b) by 465 days.

(21) Appl. No.: 12/490,863

(22) Filed: Jun. 24, 2009

(65) Prior Publication Data

US 2010/0327989 A1 Dec. 30, 2010

(51) Int. Cl.
*H01P 3/08* (2006.01)
*H03H 7/38* (2006.01)

(52) U.S. Cl.
CPC . *H01P 3/081* (2013.01); *H03H 7/38* (2013.01)

(58) Field of Classification Search
CPC ........................................................ H03H 7/38
USPC ........................... 333/238, 246, 1, 4, 5, 32, 33
See application file for complete search history.

(56) References Cited

U.S. PATENT DOCUMENTS

| 6,581,196 B2 | 6/2003 | Eisenberg et al. |
| 2011/0090028 A1* | 4/2011 | Park et al. ................. 333/238 |

FOREIGN PATENT DOCUMENTS

WO WO2009/028774 A1 * 3/2009 ............... H01P 3/08

OTHER PUBLICATIONS

S.-K. Lee et al., FEXT-eliminated stub-alternated microstrip line for multi-gigabit/second parallel links, Electronics Letters, Feb. 14, 2008, vol. 44, No. 4, The Institution of Engineering and Technology.

* cited by examiner

*Primary Examiner* — Stephen E Jones
(74) *Attorney, Agent, or Firm* — Jordan IP Law, LLC

(57) ABSTRACT

A micro-strip transmission line may include a plurality of conductors, wherein each conductor has a compensating portion and a remaining portion. The compensating portion can compensate for far-end crosstalk in the remaining portion. In one example, the compensating portion has a longitudinal section and a plurality of alternating stubs extending from lateral surfaces of the longitudinal section.

17 Claims, 6 Drawing Sheets

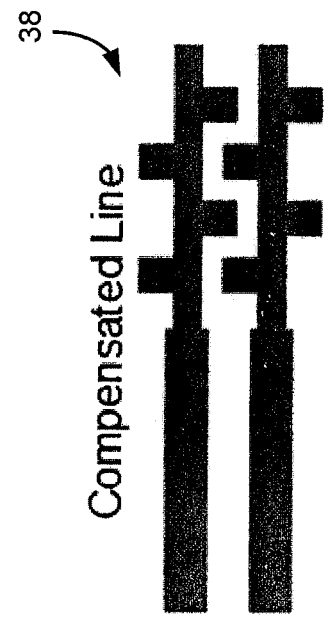
FIG. 2A
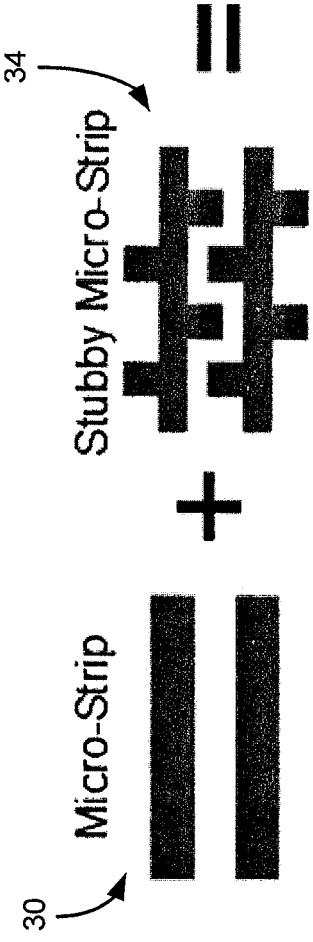
FIG. 2B
FIG. 2C
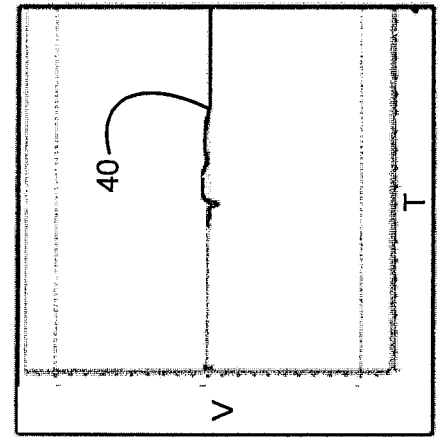
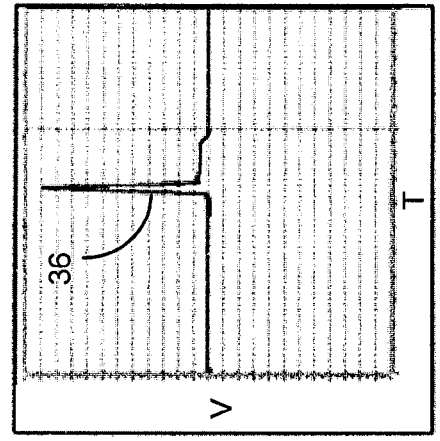
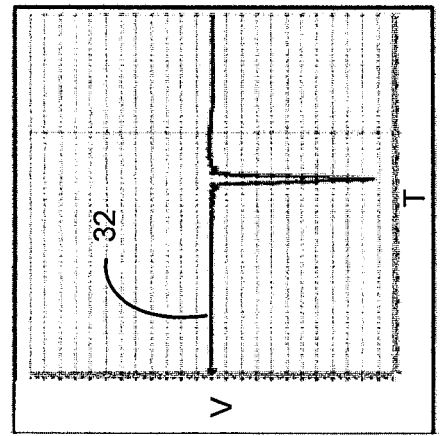

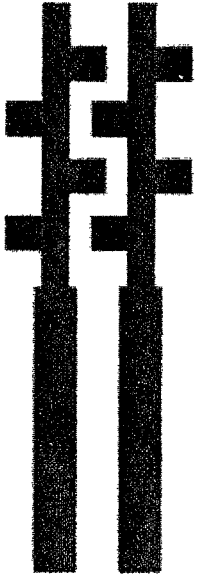
FIG. 4A Micro-Strip
FIG. 4B Stubby Micro-Strip
FIG. 4C Compensated Line
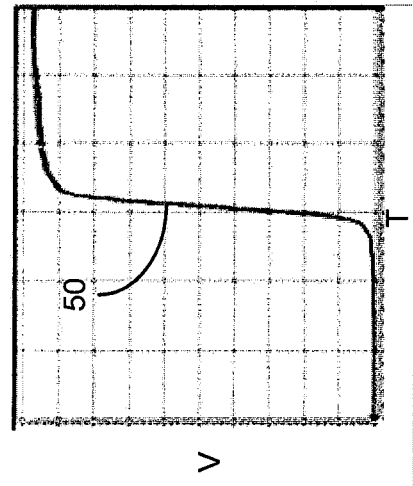
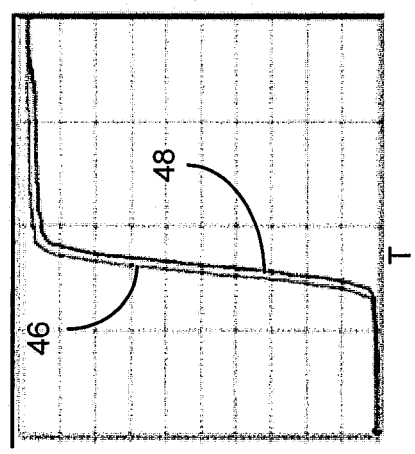
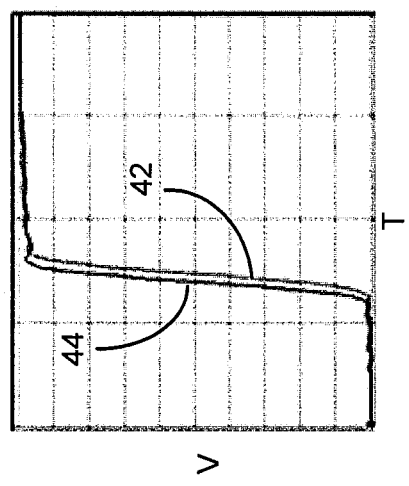
Stimulus: 500mV Step

MICRO-STRIP CROSSTALK COMPENSATION USING STUBS

BACKGROUND

1. Technical Field

Embodiments of the invention generally relate to micro-strip transmission lines. In particular, embodiments are related to the use of stubs to compensate for crosstalk in micro-strip transmission lines.

2. Discussion

Far-end crosstalk can accumulate on micro-strip transmission lines, and particularly in single-ended signaling arrangements. While certain approaches to eliminating crosstalk may be available, there still remains considerable room for improvement.

BRIEF DESCRIPTION OF THE DRAWINGS

The various advantages of the embodiments of the present invention will become apparent to one skilled in the art by reading the following specification and appended claims, and by referencing the following drawings, in which:

FIGS. 2A-2C are diagrams of an example of a scheme of formulating a crosstalk compensated line according to an embodiment of the present invention;

FIGS. 4A-4C are diagrams of an example of a scheme of formulating a timing jitter compensated line according to an embodiment of the present invention;

DETAILED DESCRIPTION

Embodiments of the present invention provide for an apparatus having a plurality of micro-strip conductors, wherein each conductor has a compensating portion and a remaining portion. The compensating portion can compensate for far-end crosstalk in the remaining portion.

Embodiments of the present invention also provide for a system with a synchronous dynamic random access memory (SDRAM), a memory controller and a plurality of micro-strip conductors coupled to the SDRAM and the memory controller. Each conductor may have a compensating portion and a remaining portion, where the compensating portion compensates for far-end crosstalk in the remaining portion.

Embodiments of the present invention also provide for a computer readable medium with a set of stored instructions which, if executed, cause an apparatus to select a geometry of a plurality of alternating stubs in which a far-end crosstalk estimate is determined for a first portion of a micro-strip conductor. A stub geometry for a second portion of the micro-strip conductor may be selected based on the far-end crosstalk estimate.

Figure 1A:
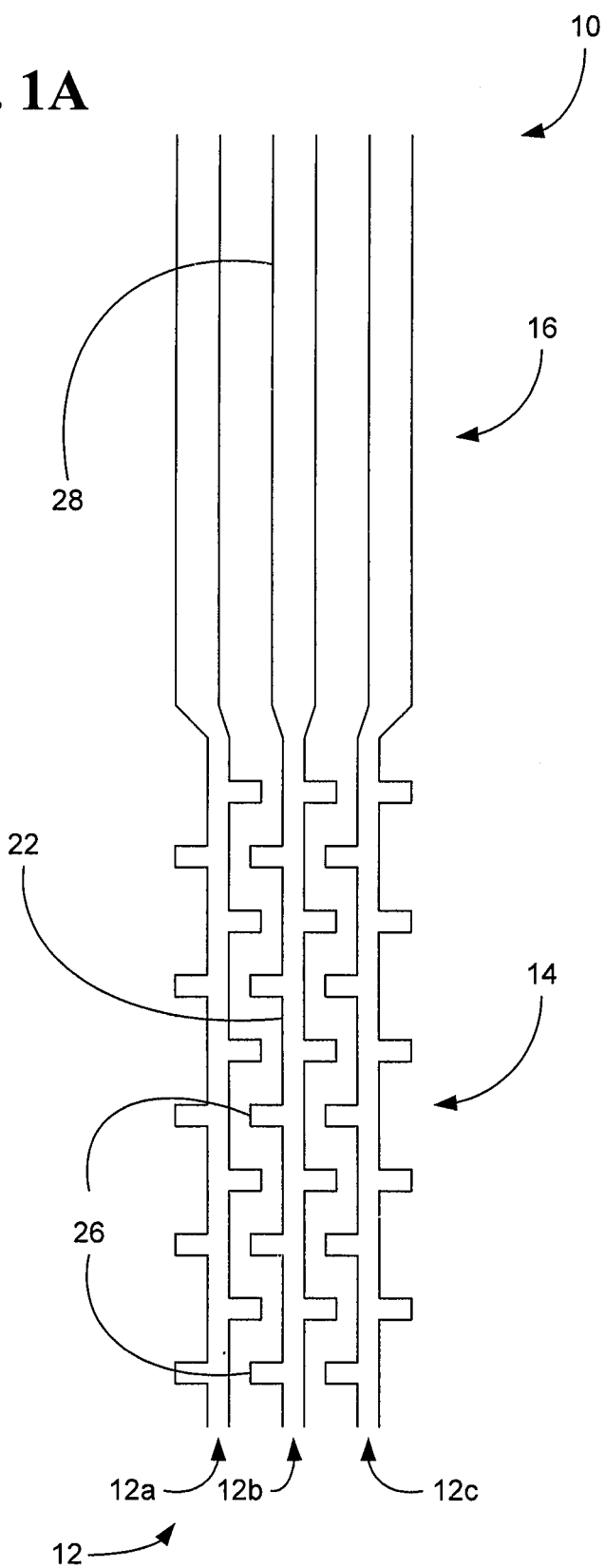
FIG. 1A is a plan view of an example of a micro-strip line according to an embodiment of the present invention.
Figure 1B:
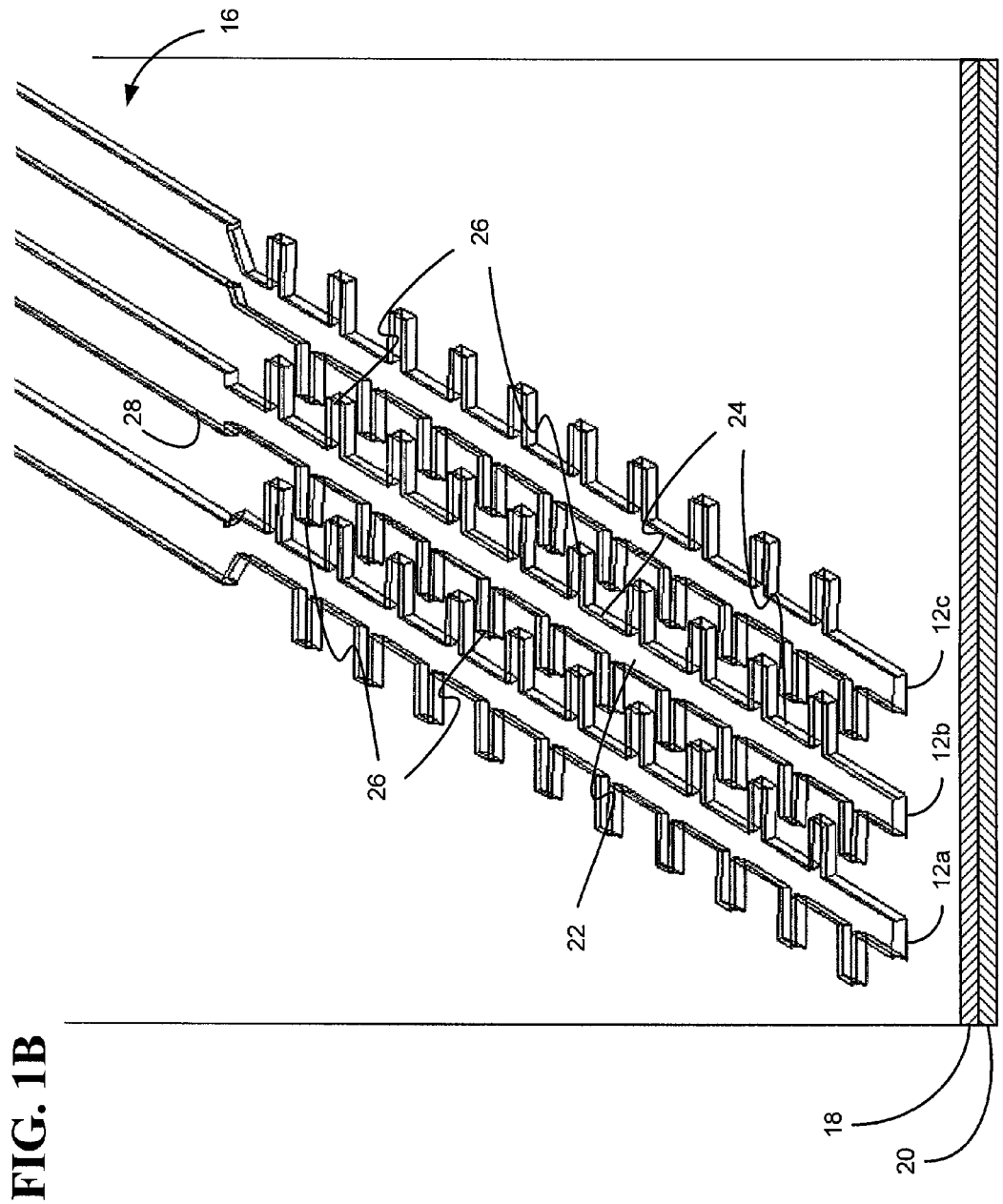
FIG. 1B is a perspective wireline view of the micro-strip line shown in FIG. 1A.

FIGS. 1A and 1B show a micro-strip transmission line 10, which may be used to propagate microwave-frequency signals in a wide variety of devices such as high-speed digital computing systems, antennas, couplers, filters, power dividers, etc. The illustrated transmission line 10 includes a plurality of mirco-strip conductors 12 (12a-12c), an external dielectric layer 18 coupled to the conductors 12, and a ground plane 20 coupled to the dielectric layer 18, wherein each conductor 12 has a compensating portion 14 and a remaining portion 16. In the illustrated example, the remaining portion 16 of the center conductor 12b might be a "victim line" in that it may be subject to far-end crosstalk (FEXT) from signals propagating in the remaining portions 16 of the neighboring conductors 12a and 12c ("aggressor lines"). Similarly, the neighboring conductors 12a and 12c may also experience far-end crosstalk from the conductor(s) neighboring those conductors. Accordingly, the compensating portion 14 of each conductor 12 may be structured to compensate for far-end crosstalk in the remaining portion 16 of the conductor in question. Thus, rather than attempting to eliminate crosstalk across the entire length of the micro-strip transmission line 10, the illustrated approach uses only a portion of the transmission line 10 to compensate for the crosstalk in the remaining portion of the line 10.

In the illustrated example, the compensating portion 14 of the center conductor 12b has a longitudinal section 22 and a plurality of alternating stubs 26 extending outward from the lateral surfaces 24 of the longitudinal section 22. The stubs 26 could be rectangular, tapered, curved, or of any other suitable shape. The remaining portion 16 of the conductor 12b may also have a longitudinal section 28, wherein the longitudinal sections 22, 28 may be substantially straight, or have some other type of geometry such as a curved geometry. It has been determined that far-end crosstalk $V_f(t)$ in a victim line conductor can be described with the following formula, $$V_f(t) = \frac{t_f}{2}\left(\frac{C_m}{C_s} - \frac{L_m}{L_s}\right)\frac{dV_i(t-t_f)}{dt}. \qquad \text{Equation 1}$$

Where $t_f$ is the time of flight of the signal in the victim line conductor, $V_i$ is the input voltage, and $C_m$, $C_s$, $L_m$ and $L_s$ are the mutual capacitance, self capacitance, mutual inductance, and self inductance, respectively, of the victim line conductor with respect to the aggressor line conductors. Because far-end crosstalk is proportional the difference between the $L_m/L_s$ and $C_m/C_s$ ratios, when the two ratios are equal, far-end crosstalk is effectively zero.

Designing a micro-strip transmission line so that the difference between the $L_m/L_s$ and $C_m/C_s$ ratios is zero for the entire length of the line, however, can be difficult and complex, and may require a substantial amount of processing overhead. The illustrated approach, therefore, selects a geometry for the compensating portions 14 of the conductors 12 that provides a value for $V_f(t)$ that offsets the value of $V_f(t)$ for the remaining portions 16 of the conductors 12. In particular, the longitudinal section 22 and the alternating stubs 26 can have a geometry that increases the $C_m/C_s$ ratio relative to the $L_m/L_s$ ratio. Indeed, micro-strip transmission lines may typically suffer from a disproportionately high $L_m/L_s$ ratio relative to the $C_m/C_s$ ratio due to the inhomogeneous boundary between the external dielectric layer 18 and air.

The illustrated compensating portions 14, which may be positioned anywhere along the length of the transmission line 10, have enough stubs 26 to increase the $C_m/C_s$ ratio so that it can dominate over the $L_m/L_s$ ratio. Simply put, the longitudinal section 22 and the plurality of alternating stubs 26 can have a geometry that provides the compensating portion 14 with a mutual capacitance to self capacitance ratio that is greater than the mutual inductance to self inductance ratio of the compensating portion 14. Moreover, the difference between the mutual capacitance to self capacitance ratio and the mutual inductance to self inductance ratio can provide each conductor 12 with a compensation voltage that cancels the voltage resulting from the far-end crosstalk.

Any increase in near-end crosstalk that may occur is small compared to the amount of far-end crosstalk that can be eliminated. The added capacitive stubs may affect impedance, but this can be compensated by adjusting trace width. The adjusted line width can be narrower, leading to an effective increase in line-to-line separation, which may further contribute to crosstalk reduction.

Figure 3:
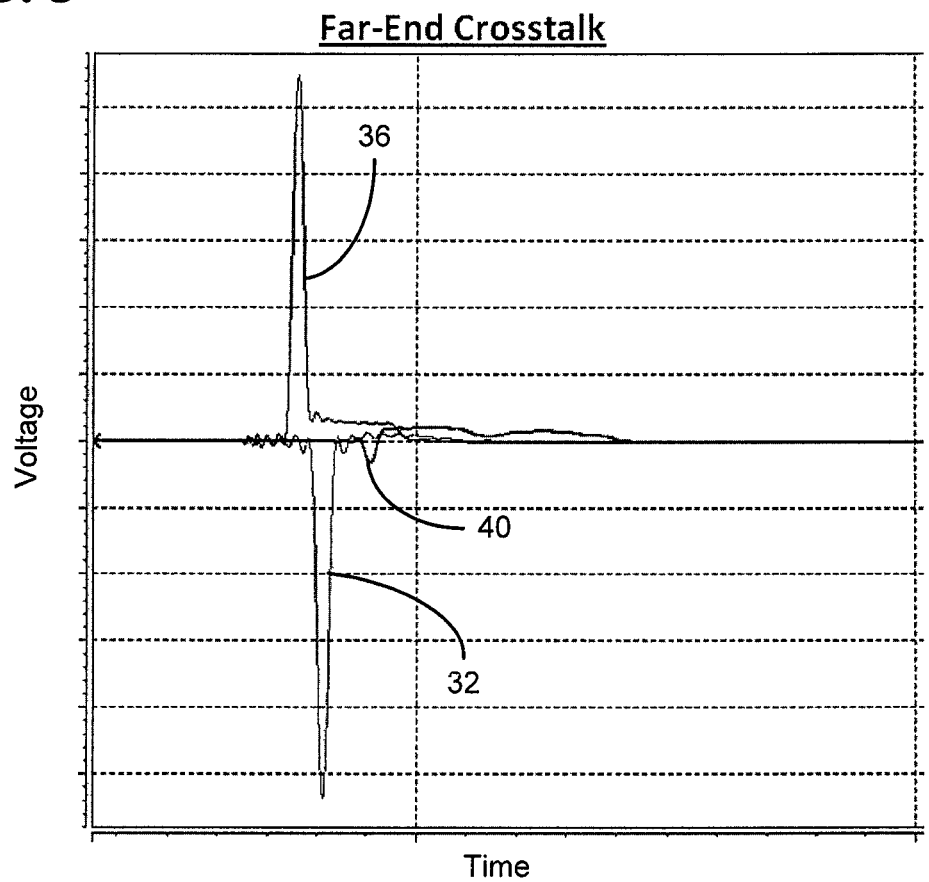
FIG. 3 is a plot of an example of a crosstalk voltage compensation curve according to an embodiment of the present invention.

FIGS. 2A-2C demonstrate that a standard micro-strip 30 having an estimated far-end crosstalk profile 32 can be coupled to a "stubby" micro-strip 34 having a far-end crosstalk profile 36 that is similar the profile 32 with the opposite polarity, to obtain a compensated line 38. Thus, the stubby micro-strip 34 may function as the compensating portion 14 (FIGS. 1A and 1B), already discussed, and the micro-strip 30 may function as the remaining portion 16 (FIGS. 1A and 1B), already discussed. In the illustrated example, the compensated line 38 has a far-end crosstalk profile 40 that is negligible. FIG. 3 shows an overlay of the curves for the profiles 32, 36 and 40, to better demonstrate the advantages of the illustrated crosstalk compensation scheme.

It may also be noted that certain micro-strip transmission lines might experience a timing delta between even and odd mode propagation delay due to data on neighboring conductors. The illustrated approach may also use the compensating portions 14 (FIGS. 1A and 1B) to compensate for crosstalk induced timing jitter (e.g., delay) in the remaining portions 16 (FIGS. 1A and 1B) of the conductors. In particular, using the plurality of alternating stubs to prevent data edges from varying in time may reduce far-end crosstalk induced timing jitter.

Figure 5:
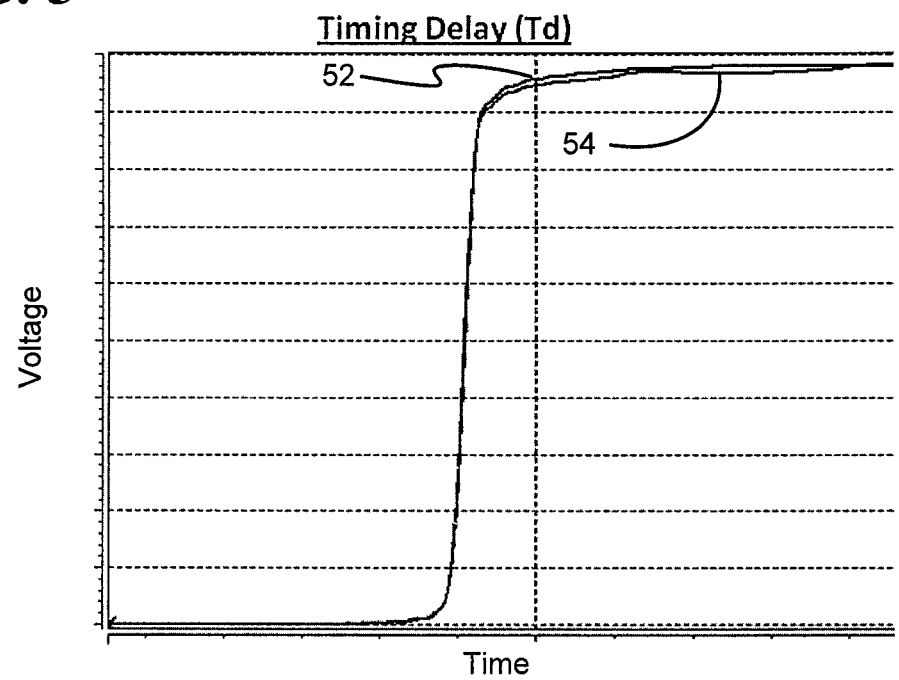
FIG. 5 is a plot of an example of a timing delay voltage compensation curve according to an embodiment of the present invention.

For example, FIGS. 4A-4C demonstrate that the standard-micro-strip 30 may have an estimated even mode delay curve 42 that leads an estimated odd mode delay curve 44 by a certain time difference. The stubby micro-strip 34 can be given a geometry that provides an even mode delay curve 46 that lags the odd mode delay curve 48 by the same time difference. As a result, the compensated line 38 may have a delay curve 50 that is effectively the same for both the even mode and the odd mode. FIG. 5 shows the overlay of the even mode delay curve 52 and the odd mode delay curve 54 to better demonstrate the advantages of the illustrated timing jitter compensation scheme.

Figure 6:
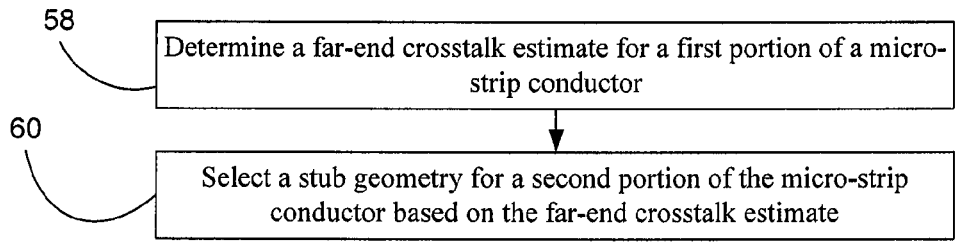
FIG. 6 is a flowchart of an example of a method of designing a micro-strip transmission line according to an embodiment of the present invention.

Turning now to FIG. 6, a method 56 of designing a micro-strip transmission line is shown. The method 56 may be implemented in executable software as a set of logic instructions stored in a machine- or computer-readable medium of a memory such as random access memory (RAM), read only memory (ROM), programmable ROM (PROM), flash memory, etc., in fixed-functionality hardware using circuit technology such as application specific integrated circuit (ASIC), complementary metal oxide semiconductor (CMOS) or transistor-transistor logic (TTL) technology, or any combination thereof. For example, computer program code to carry out operations shown in method 56 may be written in any combination of one or more programming languages, including an object oriented programming language such as Java, Smalltalk, C++ or the like and conventional procedural programming languages, such as the "C" programming language or similar programming languages.

In the illustrated example, processing block 58 provides for selecting a micro-strip conductor and determining a far-end crosstalk estimate for a first portion of the conductor. Crosstalk modeling is well known, and a number of commercially available tools and/or techniques might be used to facilitate the determination at block 58. A stub geometry for a second portion of the micro-strip conductor may be selected at block 60 based on the far-end crosstalk estimate. If an appropriate stub geometry is not available for the far-end crosstalk estimate, the geometry of the first portion of the conductor may be modified, and blocks 58 and 60 can be repeated. In addition, the operations in method 56 may be repeated for each conductor, or set of conductors in the micro-strip transmission line.

Figure 7:
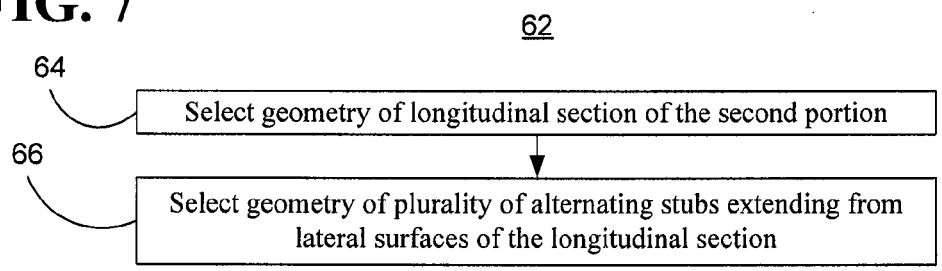
FIG. 7 is a flowchart of an example of a method of selecting a geometry of a plurality of alternating stubs according to an embodiment of the present invention.

FIG. 7 shows one approach to selecting a stub geometry for a second portion of a micro-strip conductor in method 62. Thus, method 62 may be readily substituted for processing block 60 (FIG. 6), already discussed. In the illustrated example, block 64 provides for selecting the geometry of the longitudinal section (e.g., width, height) of the second portion, and block 66 provides for selecting the geometry of a plurality of stubs (e.g., width, height, spacing) extending from lateral surfaces of the longitudinal section. As already noted, the geometries may be selected so that the second portion has a mutual capacitance to self capacitance ratio that is greater than a mutual inductance to self inductance ratio of the second portion. In particular, the difference between the mutual capacitance to self capacitance ratio and the mutual inductance to self inductance ratio can provide the conductor with a compensation voltage that cancels the voltage resulting from the far-end crosstalk estimate. As also already discussed, a timing jitter prediction can be determined for the first portion of the micro-strip conductor, where the stub geometry may be further determined based on the timing jitter prediction.

Figure 8:
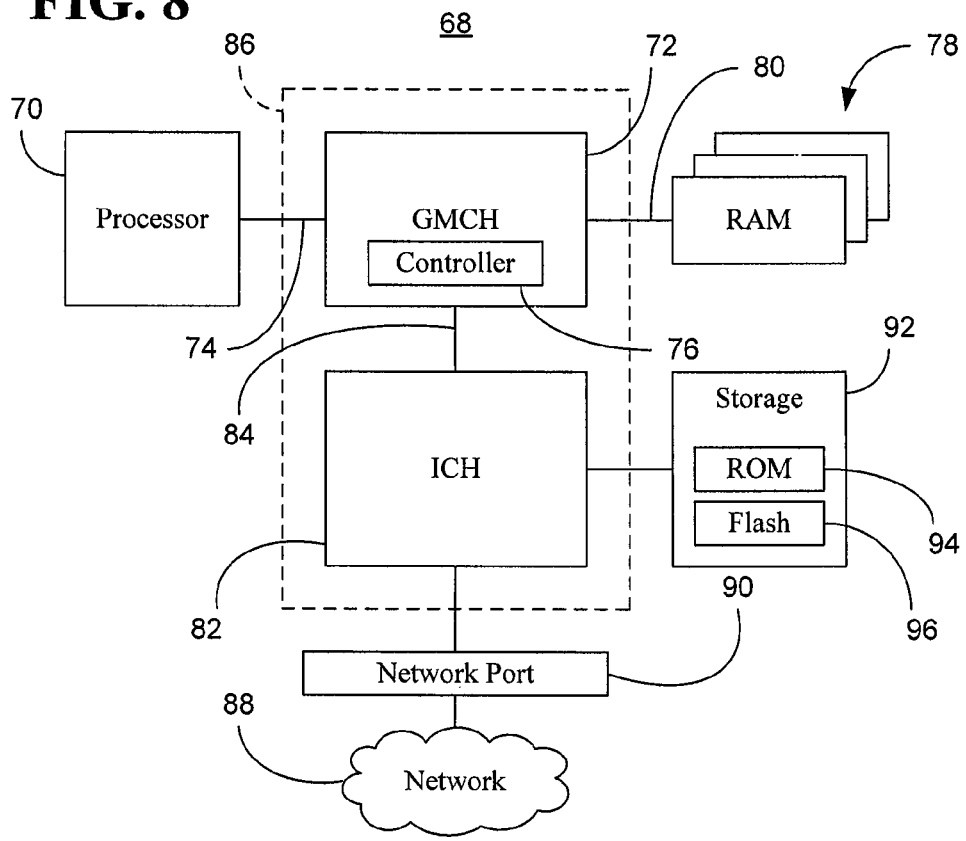
FIG. 8 is a block diagram of an example of a computing system according to an embodiment of the present invention.

FIG. 8 shows a computing system 68, which could be part of a server, desktop personal computer (PC), notebook PC, personal digital assistant (PDA), wireless "smart" phone, and so on. The illustrated system 68 has a microprocessor 70, which may have one or more processor cores (not shown), where each core may be fully functional with instruction fetch units, instruction decoders, level one (L1) cache, execution units, and so on. The microprocessor 70 can communicate with a graphic model and memory controller hub (GMCH) 72, also known as a Northbridge, via a front side bus 74. The front side bus 74 could alternatively be replaced by a point-to-point fabric that interconnects each of the components in the system 68. The GMCH 72, which may include a controller 76, can communicate with system random access memory (RAM) 78 via a memory bus 80. The memory bus 80 may include one or more micro-strip transmission lines as discussed above, and could compensate for crosstalk associated with single-ended or differential signaling. In fact, micro-strip transmission lines could also be used to compensate for package or socket crosstalk (given the source of the crosstalk is from the same aggressor(s) that the victim is directly coupled to on the board). In one embodiment, the RAM 78 includes dual data rate (DDR) synchronous dynamic random access dynamic random access memory (SDRAM, e.g., DDR3 SDRAM JEDEC Standard JESD79-3C, April 2008) modules. The modules of the RAM 78 may be incorporated into a single inline memory module (SIMM), dual inline memory module (DIMM), small outline DIMM (SODIMM), and so on. The GMCH 72 may also include one or more graphics devices (not shown).

The illustrated GMCH 72 communicates with an I/O controller hub (ICH) 82, also known as a Southbridge, via a hub bus 84. The GMCH 72 and the ICH 82 are sometimes referred to as a chipset 86. The microprocessor 70 may also be operatively connected to a network 88 via a network port 90 through the ICH 82. The ICH 82 may also be coupled to storage 92, which may include a read only memory (ROM) 94, flash memory 96, etc.

Thus, employing the above techniques to single-ended interconnect implementations in which DDR3 signals are routed on external layers could provide significant advantages. For example, compensation through the application of a "stubby" micro-strip can 1) substantially reduce or eliminate transmission line induced crosstalk from neighboring lines, 2) improve timing margins by substantially reducing or eliminating crosstalk-induced jitter, 3) allow for tighter grouping between signals on the printed circuit board, and 4) compensate for crosstalk induced in densely routed escape regions, like package and ball grid array (BGA) break-outs, and package and socket induced crosstalk. Thus, in total, application of embodiments of the invention can reduce board layer count and cost, while improving performance and allowing higher bus speeds—allowing more freedom in selecting cost and performance tradeoffs. Moreover, the above techniques can be used for a wide variety of bus protocols.

Embodiments of the present invention are applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" is used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. An apparatus comprising:
   a plurality of micro-strip conductors, each conductor having a compensating portion coupled with a remaining portion, the compensating portion including a plurality of stubs to compensate for crosstalk in the remaining portion, wherein a first stub of the plurality of stubs nearest to the remaining portion and a second stub of the plurality of stubs farthest from the remaining portion sandwich all remaining stubs of the plurality of stubs, wherein the second stub is adjacent to a stub only in a direction facing the remaining portion towards the first stub, and wherein a length of the compensating portion from the first stub to the second stub is less than a length of the remaining portion.

2. The apparatus of claim 1, wherein the remaining portion has a substantially straight longitudinal section.

3. The apparatus of claim 1, wherein the compensating portion is to further compensate for crosstalk induced timing jitter in the remaining portion.

4. The apparatus of claim 1, wherein the compensating portion has a total length that is approximately equal to a total length of the remaining portion being compensated.

5. The apparatus of claim 1, wherein the compensating portion includes:
   a longitudinal section having lateral surfaces; and
   a plurality of alternating stubs extending from the lateral surfaces.

6. The apparatus of claim 5, wherein the longitudinal section and the plurality of alternating stubs have a geometry that is to provide the compensating portion with a mutual capacitance to self capacitance ratio that is greater than a mutual inductance to self inductance ratio of the compensating portion.

7. The apparatus of claim 6, wherein a difference between the mutual capacitance to self capacitance ratio and the mutual inductance to self inductance ratio is to provide the conductor with a compensation voltage that cancels a voltage resulting from the crosstalk in the remaining portion.

8. A system comprising:
   a synchronous dynamic random access memory;
   a memory controller; and
   a plurality of micro-strip conductors coupled to the memory and the memory controller, each conductor having a compensating portion coupled with a remaining portion, the compensating portion including a plurality of stubs to compensate for crosstalk in the remaining portion, wherein a first stub of the plurality of stubs nearest to the remaining portion and a second stub of the plurality of stubs farthest from the remaining portion sandwich all remaining stubs of the plurality of stubs, wherein the second stub is adjacent to a stub only in a direction facing the remaining portion towards the first stub, and wherein a length of the compensating portion from the first stub to the second stub is less than a length of the remaining portion.

9. The system of claim 8, wherein the remaining portion has a substantially straight longitudinal section.

10. The system of claim 8, wherein the compensating portion is to further compensate for crosstalk induced timing jitter in the remaining portion.

11. The system of claim 8, further including a circuit board having an external dielectric layer coupled to the memory, the memory controller and the plurality of micro-strip conductors.

12. The system of claim 8, wherein the circuit board further includes a ground plane coupled to the external dielectric layer.

13. The system of claim 8, wherein the memory includes a dual data rate memory.

14. The system of claim 8, further including a processor coupled to the memory controller.

15. The system of claim 8, wherein the compensating portion includes:
    a longitudinal section having lateral surfaces; and
    a plurality of alternating stubs extending from the lateral surfaces.

16. The system of claim 15, wherein the longitudinal section and the plurality of alternating stubs have a geometry that is to provide the compensating portion with a mutual capacitance to self capacitance ratio that is greater than a mutual inductance to self inductance ratio of the compensating portion.

17. The system of claim 16, wherein a difference between the mutual capacitance to self capacitance ratio and the mutual inductance to self inductance ratio is to provide the conductor with a compensation voltage that cancels a voltage resulting from the crosstalk in the remaining portion.

\* \* \* \* \*